United States Patent [19]

Neilson et al.

[11] Patent Number: 5,468,668
[45] Date of Patent: Nov. 21, 1995

[54] METHOD OF FORMING MOS-GATED SEMICONDUCTOR DEVICES HAVING MESH GEOMETRY PATTERN

[75] Inventors: John M. S. Neilson, Norristown; Carl F. Wheatley, Jr., Drums; Frederick P. Jones, Mountaintop, all of Pa.; Victor A. K. Temple, Clifton, N.Y.

[73] Assignee: Harris Corporation, Melbourne, Fla.

[21] Appl. No.: 368,612

[22] Filed: Jan. 4, 1995

Related U.S. Application Data

[62] Division of Ser. No. 158,444, Nov. 29, 1993, Pat. No. 5,399,892.

[51] Int. Cl.⁶ .................................................. H01L 21/77
[52] U.S. Cl. ............................... 437/51; 437/48; 437/56; 148/DIG. 126
[58] Field of Search ................................. 437/47, 51, 56, 437/913, 48, 50; 148/DIG. 126

[56] References Cited

U.S. PATENT DOCUMENTS

| | | | |
|---|---|---|---|
| 4,561,003 | 12/1985 | Tihanyi et al. | 257/341 |
| 4,644,637 | 2/1987 | Temple | 148/DIG. 126 |
| 4,677,452 | 6/1987 | Zommer . | |
| 4,833,513 | 5/1989 | Sasaki | 257/342 |
| 5,262,339 | 11/1993 | Mori et al. | 148/DIG. 126 |
| 5,288,653 | 2/1994 | Enjoh | 148/DIG. 126 |
| 5,395,776 | 3/1995 | Shibib | 437/51 |

FOREIGN PATENT DOCUMENTS 2575334  12/1984  France .

Primary Examiner—Brian E. Hearn
Assistant Examiner—Michael Trinh
Attorney, Agent, or Firm—Rogers & Killeen

[57] ABSTRACT

A pattern for a wafer for a MOS-gated semiconductor device includes plural ribbons extending from a source contact region to another source contact region, each of the ribbons having a single source region between two channel regions, so as to increase the device's current-carrying capability per unit area relative to the prior art. The pattern increases the size of the active current-carrying area (the channel and neck regions of the device) relative to the area of the source contact areas. The source contact regions may be discrete or linear, and the ribbons may extend therefrom perpendicularly or at other angles.

10 Claims, 4 Drawing Sheets

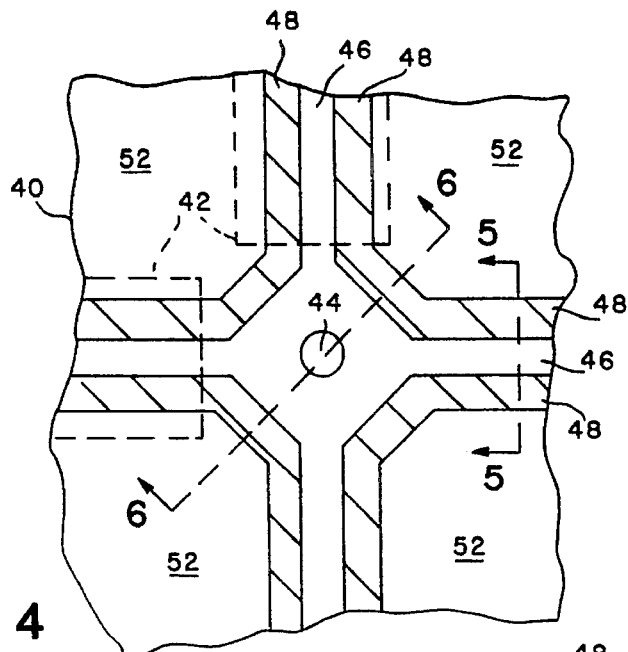
FIG. 4
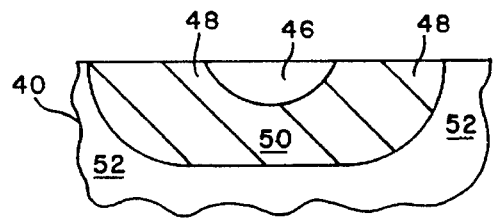
FIG. 5
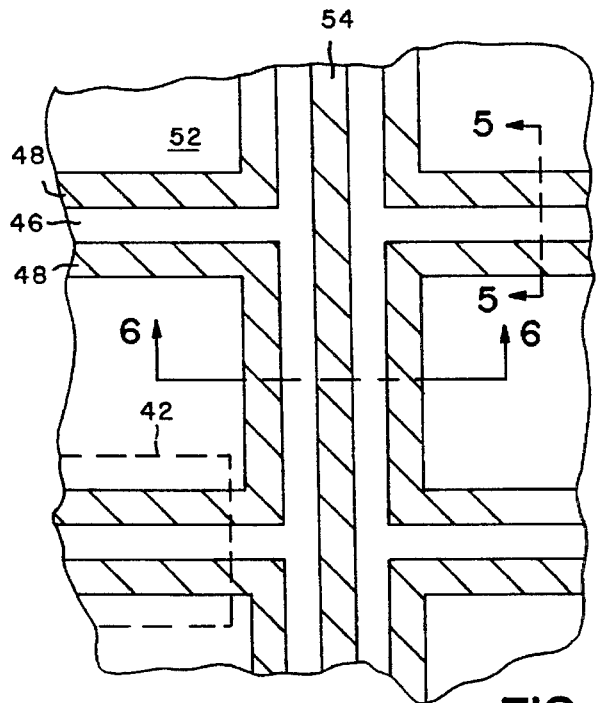
FIG. 6
FIG. 7

5,468,668

1

METHOD OF FORMING MOS-GATED SEMICONDUCTOR DEVICES HAVING MESH GEOMETRY PATTERN

This is a division of application Ser. No. 08/158,444, filed Nov. 29, 1993, now U.S. Pat. No. 5,399,892.

BACKGROUND OF THE INVENTION

The pre invention is directed to a structure for a MOS-gated semiconductor device that increases the size of the active current-carrying area of the device relative to the device's contact areas, and more particularly to a mesh structure for a wafer used in a MOS-gated semiconductor device that relatively increases the size of the channel and neck regions and decreases the size of the source contact regions.

Known power MOSFET's may comprise a multiplicity of individual cells that may be electrically connected in parallel. The cells are typically small; for example, each cell may be about twenty-five microns in width so that tens of thousands may be formed on a single silicon wafer on the order of 300 mils square. A number of geometric arrangements for the unit cells are possible, including elongated strips.

In power MOSFET's, it is known to form such devices by a double diffusion technique which begins with a common drain region of, for example, N conductivity type material, that is formed on a N+ conductivity type substrate. Within the drain region, a base region is formed by means of a first diffusion to introduce impurities of one type, and then a source region is formed entirely within the base region by means of a second diffusion to introduce impurities of the opposite type. If the drain region is N type, then the first diffusion is done with acceptor impurities to produce a P type base region, and the second diffusion is done with donor impurities to produce a N+ type source region. At the drain region surface, the base region exists as a band between the source and drain regions.

Conductive gate electrodes are formed on the surface over the base region band and separated by a gate insulating layer to define an insulated gate electrode structure. When voltage of a proper polarity is applied to the gate electrodes during operation, an electric field extends through the gate insulating layer into the base region inducing a conductive channel just under surface. Current flows horizontally between the source and drain region through the conductive channel.

With reference now to FIG. 1, known MOS-gated semiconductor devices may include a multi-layer wafer 12 overlain with a gate 14 and source metal 16. For example, in a metal oxide semiconductor field effect transistor (MOSFET) the layers may include an N+ substrate 18, an N− voltage supporting layer 20, a body region 22 implanted in the voltage supporting layer 20, and an N+ source region 24 implanted in the body region 22. As may be seen in FIG. 1, the body regions 22 and source regions 24 may form cells separated by portions of the voltage supporting layer 20. The region between the cells near the surface of the wafer is known as the neck region 26 and the region between the source region and the neck region near the surface of the wafer is known as the channel region 28. The channel region 28 and the neck region 26 are the active current-carrying areas of the device.

Various patterns for the MOS-gated device's cellular structure are known in the art. A hex geometry pattern is illustrated in FIG. 1, a stripe geometry pattern is illustrated

2 in FIG. 2 and an atomic lattice pattern is illustrated in FIG. 3. It may be seen that a wafer 12 for a MOS-gated semiconductor device often includes a vertical cross section showing the cellular structure (for example, as seen on the left-hand face of the vertical cross sections of FIGS. 1–3). Note that other cross sections (for example, the right-hand face of the vertical cross sections of FIGS. 2–3) may not include the cellular structure.

To increase the current-carrying capability of a MOS-gated semiconductor device, it is desirable to increase the current-carrying area per unit area of device. With reference to FIGS. 1–3, one of the regions that takes up current-carrying area is the region in the center of each cell or stripe that is contacted by the source metal 16. This region is known as the source contact region 30.

One method by which the current carrying area can be increased is to reduce the area at the top surface of the chip utilized by the source contact area. This reduction must be made, if at all, while (a) providing sufficient source contacts; (b) maintaining an upper surface structure which permits ready access to the source contact area and to the distribution of gate voltage over the channel regions; and (c) maintaining or improving the amount of channel area; all while maintaining a topography which is readily manufacturable.

Accordingly, it is an object of the present invention to reduce the size of the source contact region relative to the size of the active current-carrying area of the device, while maintaining the cellular structure of MOS-gated devices.

It is a further object of the present invention to provide a novel pattern for a wafer used in a MOS-gated semiconductor device in which the pattern includes an array of ribbons extending linearly from a source contact region, each of the ribbons having a single source region between two channel regions.

These and many other objects and advantages of the present invention will be readily apparent to one skilled in the art to which the invention pertains from a perusal of the claims, the appended drawings, and the following detailed description of preferred embodiments.

DESCRIPTION OF THE DRAWINGS

FIG. 4 is a partial plan view of a surface of a wafer for a MOS-gated semiconductor device illustrating the linearly extending ribbons of the present invention.

FIG. 5 is a vertical cross-section through line 5—5 of FIG. 4.

FIG. 6 is a vertical cross section through line 6—6 of FIG. 4.

FIG. 7 is a partial plan view of the surface of a wafer for a MOS-gated semiconductor device illustrating an alternative embodiment of the linearly extending ribbons of the present invention.

DESCRIPTION OF PREFERRED EMBODIMENTS

Figure 1:
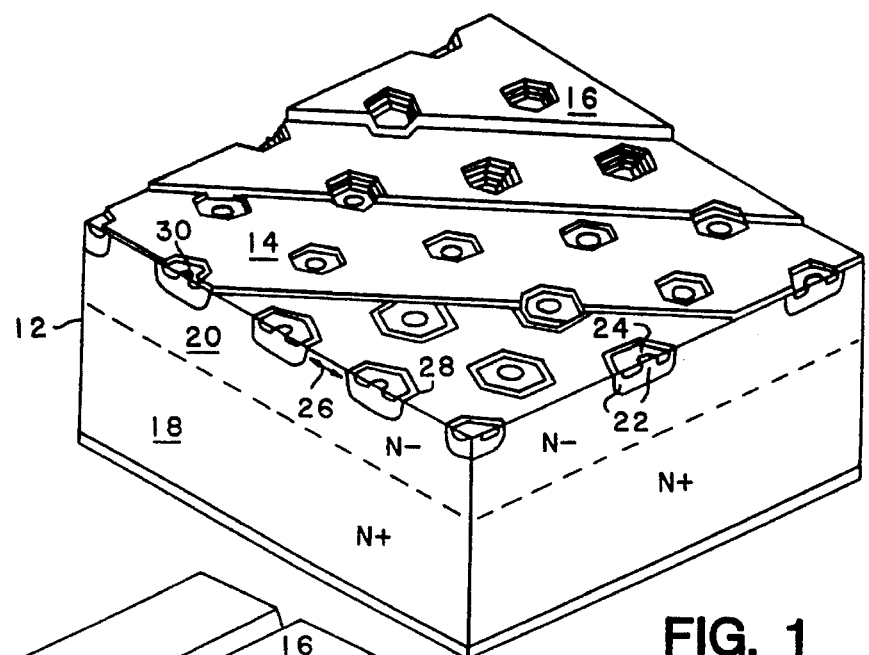
FIG. 1 is a partial pictorial view of a hex geometry MOS-gated semiconductor device of the prior art in vertical cross section.
Figure 2:
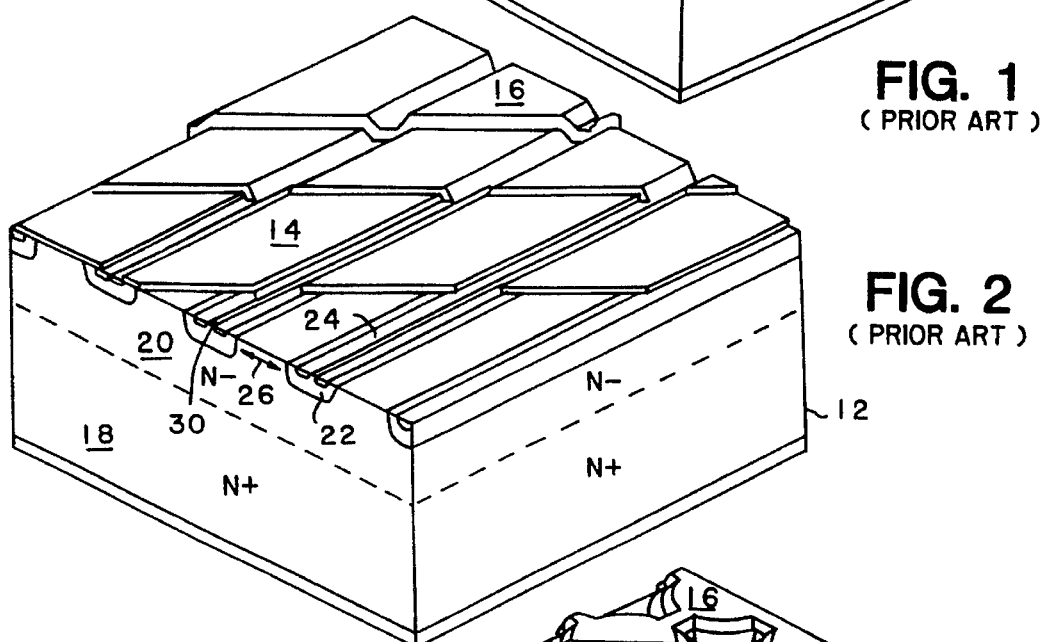
FIG. 2 is a partial pictorial view of a stripe geometry MOS-gated semiconductor device of the prior art in vertical cross section.
Figure 3:
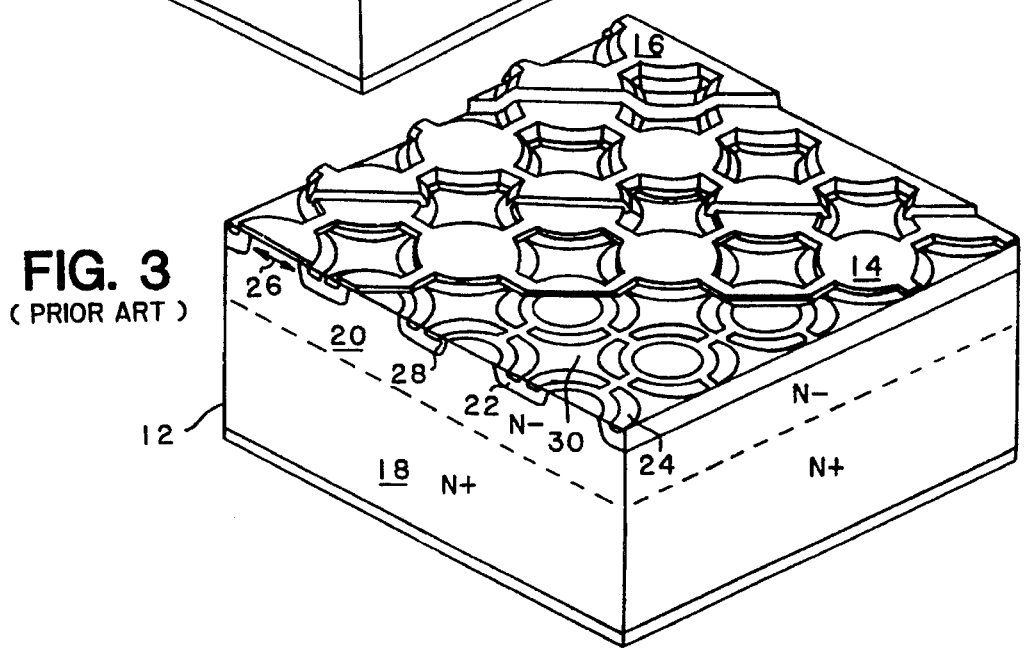
FIG. 3 is a partial pictorial view of an atomic lattice geometry MOS-gated semiconductor device of the prior art in vertical cross section.

With reference now to FIG. 4, an embodiment of the present invention may include a pattern for a wafer 40 for a MOS-gated semiconductor device in which plural ribbons 42 extend from a source contact region 44 to other source contact regions 44. Each of the ribbons 42 may include a single source region 46 between two channel regions 48. As may be seen in FIGS. 5 and 6 (vertical cross sections through lines 5—5 and 6—6 of FIG. 4), the two channel regions 48 extend into the wafer 40 and connect beneath the source region 46 forming a body region 50, while maintaining the cellular structure of the device. Neck regions 52 are between the ribbons 42.

The pattern of the present invention increases the size of the active current-carrying area (the current-carrying area including the channel regions 48 and the neck regions 52) relative to the size of the source contact regions 44, thereby providing greater current-carrying capability per unit area compared to the prior art.

With reference now to FIG. 7, in a further embodiment of the present invention the discrete source contact regions 44 illustrated in FIG. 4 may be extended to form a linear source contact region 54. As in the embodiment of FIG. 4, the ribbons 42 extend from the linear region 54 to other linear regions 54.

Figure 8:
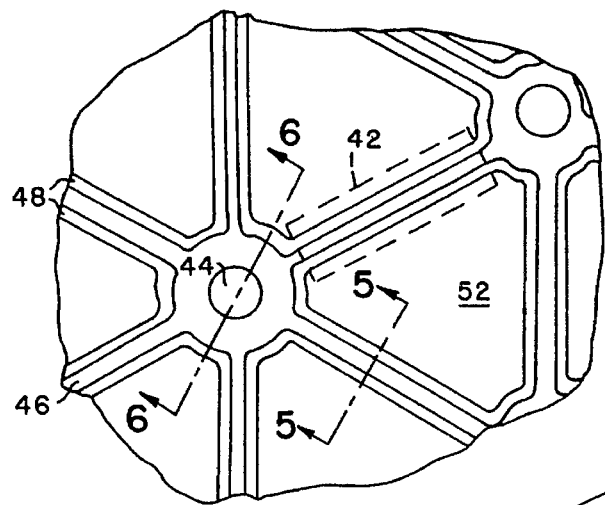
FIG. 8 is a partial plan view of the surface of a wafer for a MOS-gated semiconductor device illustrating another alternative embodiment of the linearly extending ribbons of the present invention.
Figure 9:
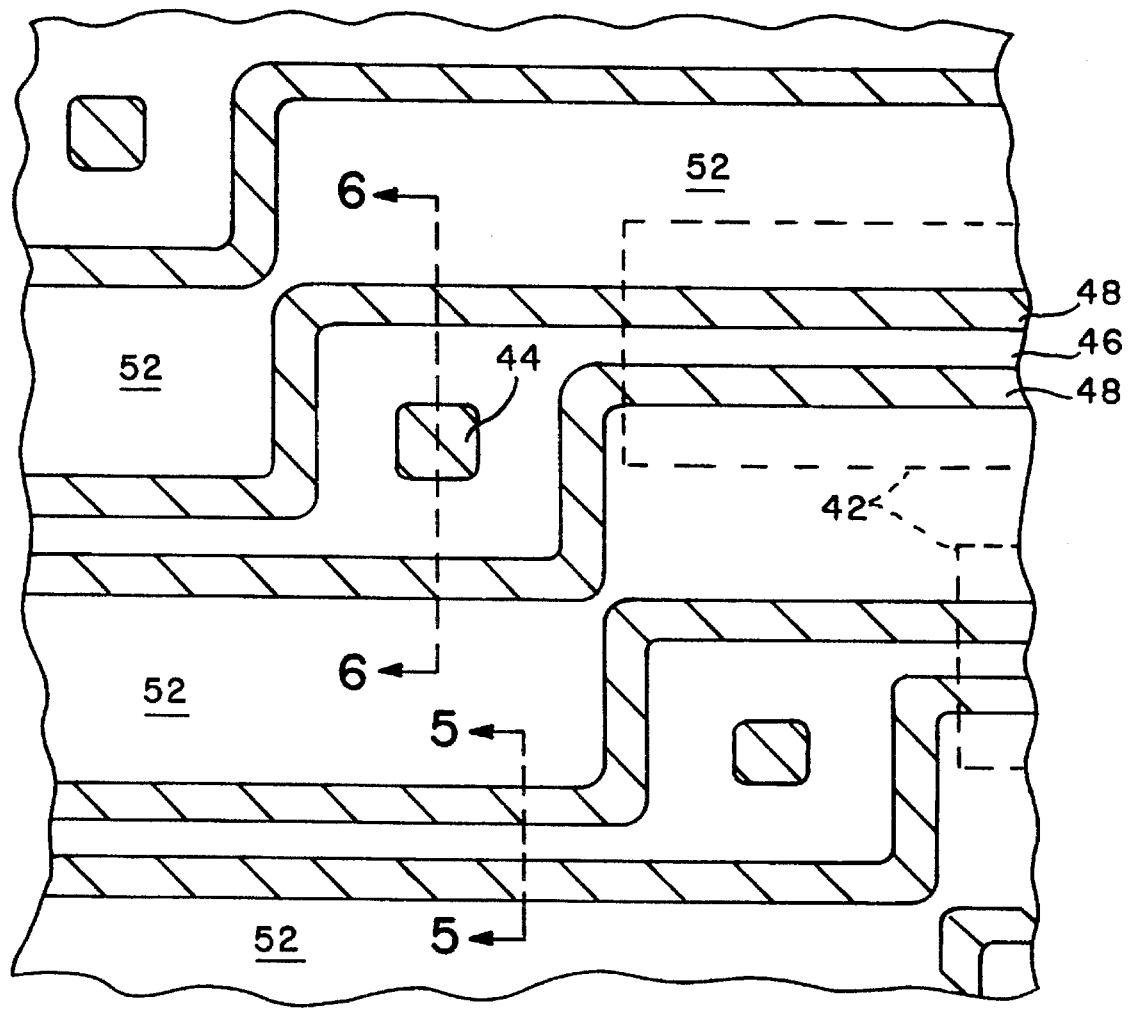
FIG. 9 is a partial plan view of the surface of a wafer for a MOS-gated semiconductor device illustrating yet another alternative embodiment of the linearly extending ribbons of the present invention.

The ribbons 42 of the present invention may extend from discrete source contact regions 44 (or linear source contact regions 54) at angles or in arrangements other than those illustrated in FIGS. 4 and 7. For example, as seen in FIG. 8 the ribbons 42 may be formed at 60° angles to each other, or as seen in FIG. 9, the ribbons 42 may be offset as they extend in parallel from the source contact regions 44.

Figure 10:
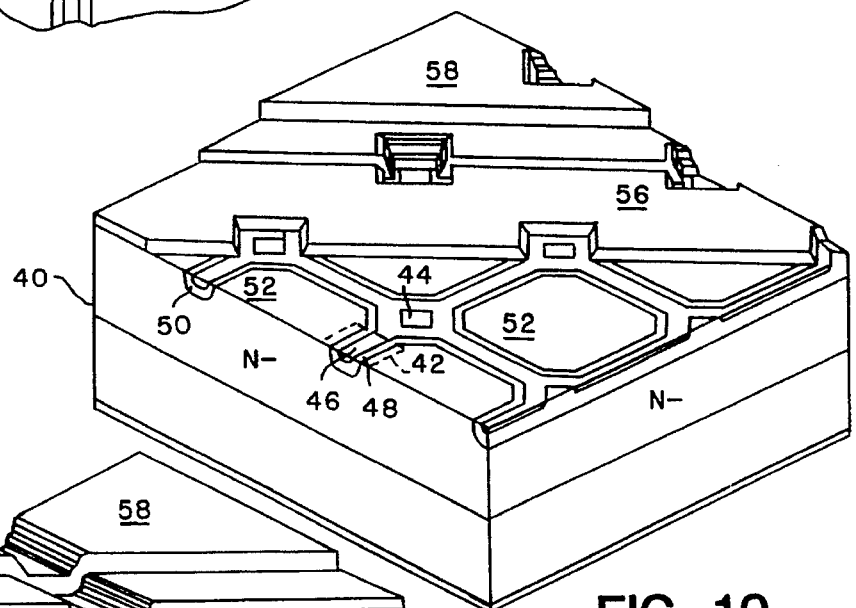
FIG. 10 is a partial pictorial view of a MOS-gated semiconductor device of the present invention illustrating an embodiment of the pattern of FIG. 4 in vertical cross section.
Figure 11:
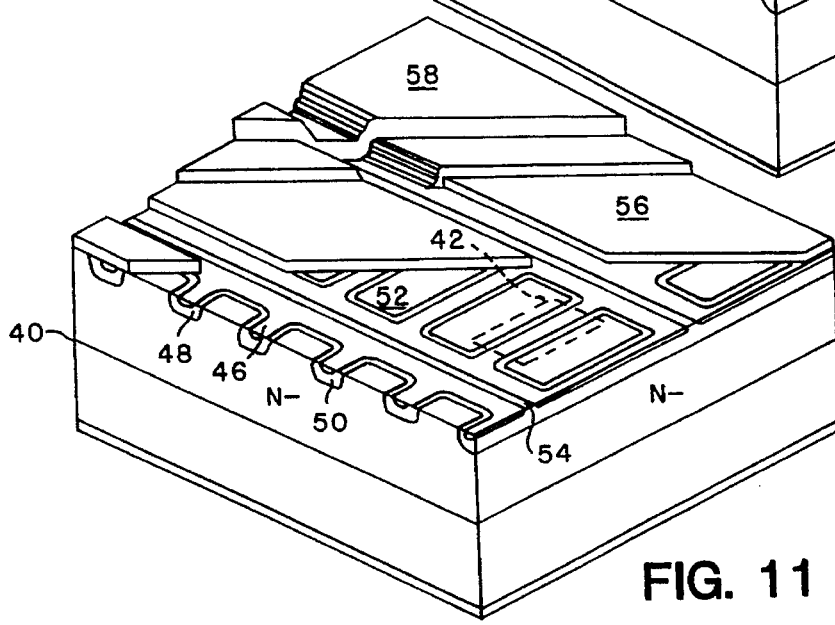
FIG. 11 is a partial pictorial view of a MOS-gated semiconductor device of the present invention illustrating an embodiment of the pattern of FIG. 7 in vertical cross section.

The patterns of the present invention may be more clearly seen with reference to FIGS. 10 and 11 in which the same element numbers as in FIGS. 4 and 7 have been used to facilitate an understanding thereof. The gate 56 and source metal 58 are added as in the prior art.

The method of manufacturing a MOS-gated semiconductor device of the present invention may include the following steps:

a. Grow an N-type epitaxial layer on an appropriate substrate, N+ for MOSFET or P+ for an insulated gate bipolar transistor (IGBT).

b. Oxidize the wafer, photomask and etch the oxide to produce a mesh oxide pattern that will define the body regions 50.

c. Photomask with the body region pattern to exclude the body region implant from the edge of the device.

d. Implant and diffuse the body regions 50.

e. Photomask with the source contact region 44, 54 pattern and implant and diffuse the source contact regions 44, 54.

f. Photomask with the source regions 46, allowing the source regions to be defined by the same mesh oxide that define the body regions 50.

g. Implant and diffuse the source regions 46.

h. Strip the mesh oxide and grow gate oxide.

i. Deposit and dope the polysilicon gate 56, photomask and etch the polysilicon gate.

j. Deposit the interlayer dielectric and define the contact openings, deposit and define the source metal 58, deposit and define overcoat.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

We claim:

1. A method of making a MOS-gated semiconductor device comprising the steps of:

a. growing an epitaxial layer of a first conductivity type on a substrate of either the first or a second conductivity type;

b. doping a body region of the second conductivity type in a mesh pattern in the epitaxial layer so that the body region forms ribbons extending from nodes in the mesh pattern;

c. doping source contact regions of the second conductivity type into the body region at the nodes of the mesh pattern; and d. doping source regions of the first conductivity type in the body region to a depth less than the depth of the body region so as to form channel regions of the first conductivity type on both sides of the source regions.

2. The method of claim 1 wherein the nodes are generally linear and the ribbons extend perpendicularly therefrom.

3. The method of claim 1 wherein the ribbons extend radially from the nodes.

4. The method of claim 3 wherein the ribbons extend at about 60° to each other.

5. The method of claim 3 wherein the ribbons extend at about 90° to each other.

6. A method of making a MOS-gated semiconductor device comprising the steps of:

(a) providing a surface layer of a first conductivity type on a substrate of either the first or a second conductivity type;

(b) providing a mesh pattern of ribbons that each extend from a source contact region of a first conductivity type in the surface layer of the device, each of the ribbons having a single source region of a second conductivity type between two channel regions of the first conductivity type connected beneath the source region by a body region of the first conductivity type; and (c) providing a neck region of the second conductivity type between each of the ribbons.

7. The method of claim 6 wherein the source contact region is at a node of the mesh pattern.

8. The method of claim 7 wherein the ribbons extend radially from the source contact region.

9. The method of claim 6 wherein the source contact region is linear and the ribbons extend generally perpendicular therefrom.

10. The method of claim 6 wherein the surface layer is provided by growing an epitaxial layer.

* * * * *